United States Patent
Wang et al.

(10) Patent No.: US 12,411,188 B2
(45) Date of Patent: Sep. 9, 2025

(54) SIGNAL PROCESSING CIRCUIT FOR TUNNELING MAGNETORESISTANCE SENSOR

(71) Applicant: Wenzhou University, Zhejiang (CN)

(72) Inventors: Pengjun Wang, Zhejiang (CN); Xiangyu Li, Zhejiang (CN); Bo Chen, Zhejiang (CN); Hao Ye, Zhejiang (CN)

(73) Assignee: Wenzhou University, Zhejiang (CN)

( * ) Notice: Subject to any disclaimer, the term of this patent is extended or adjusted under 35 U.S.C. 154(b) by 164 days.

(21) Appl. No.: 18/540,872

(22) Filed: Dec. 15, 2023

(65) Prior Publication Data
US 2024/0337707 A1    Oct. 10, 2024

(30) Foreign Application Priority Data
Apr. 10, 2023 (CN) .......................... 202310368942.4

(51) Int. Cl.
*G01R 33/00* (2006.01)
*G01R 33/09* (2006.01)

(52) U.S. Cl.
CPC ....... *G01R 33/0029* (2013.01); *G01R 33/098* (2013.01)

(58) Field of Classification Search
CPC ............ G01R 33/0023; G01R 33/0029; G01R 33/02; G01R 33/06; G01R 33/09–098; G01D 5/12; G01D 5/14; G01D 5/16; G01D 5/244; G01D 5/245
See application file for complete search history.

(56) References Cited

U.S. PATENT DOCUMENTS

| | | | | |
|---|---|---|---|---|
| 10,284,204 | B2 * | 5/2019 | Feng | H03K 3/037 |
| 2014/0121787 | A1 * | 5/2014 | Yamazaki | H02M 3/156 |
| | | | | 700/19 |
| 2022/0366836 | A1 * | 11/2022 | Lee | G11C 19/28 |

* cited by examiner

*Primary Examiner* — Huy Q Phan
*Assistant Examiner* — David B Frederiksen
(74) *Attorney, Agent, or Firm* — JCIPRNET

(57) ABSTRACT

A signal processing circuit for a tunneling magnetoresistance sensor comprises thirty-eight MOS transistors, two capacitors and ten switches. A first switch, a second switch, a third switch, a fourth switch, a first MOS transistor, a second MOS transistor, a third MOS transistor and a fourth MOS transistor form a high-frequency modulation circuit. A fifth switch, a sixth switch, a seventh switch, an eighth switch, a seventeenth transistor, a twenty-second MOS transistor and a twenty-third MOS transistor form a high-frequency demodulation circuit. A signal output by a tunneling magnetoresistance sensor is modulated to a chopping frequency by the high-frequency modulation circuit, and is then demodulated by the high-frequency demodulation circuit.

2 Claims, 4 Drawing Sheets

SIGNAL PROCESSING CIRCUIT FOR TUNNELING MAGNETORESISTANCE SENSOR

CROSS-REFERENCE TO RELATED APPLICATION

This application claims the priority benefit of China application serial no. 202310368942.4, filed on Apr. 10, 2023. The entirety of the above-mentioned patent application is hereby incorporated by reference herein and made a part of this specification.

BACKGROUND OF THE INVENTION

1. Technical Field

The invention relates to signal processing circuits, in particular to a signal processing circuit for a tunneling magnetoresistance sensor.

2. Description of Related Art

In recent years, the deeper study on magnetoelectronics leads to a rapid development of micro tunneling magnetoresistance sensors with a multi-layer film structure. The micro tunneling magnetoresistance sensors, as microminiature devices designed and produced by means of the thin-film resistor process, are not only widely used in the military fields such as aerospace GPS navigation and satellites, but also widely used in every aspect of people's civil life, for example, the micro tunneling magnetoresistance sensors play an indispensable role in the civil fields such as automotive electronics, biomedical treatment, environmental monitoring, IoT and smart phones, thus having a great market demand. Tunneling magnetoresistance sensors will become the focus of competition in magnetoresistance sensors in the future because of their high sensitivity, miniaturization, low cost, low power consumption, high integration, high response frequency and other characteristics.

The tunneling magnetoresistance sensors are so designed that magnetic tunneling junctions are prepared through a magnetron sputtering method and then multiple magnetic tunneling junctions are connected in series to form a tunnelling magnetoresistor, such that the change rate of the magnetoresistance of the tunnelling magnetoresistor can be greatly increased, and the sensitivity of the tunnelling magnetoresistor is greatly improved. However, when applied to the high-precision magnetic detection field, the tunneling magnetoresistance sensors with high magnetic field sensitivity have loud background noise, and particularly, the noise of the tunneling magnetoresistance sensors in the magnetization reversing process of the magnetic tunneling junctions is several times louder than the noise in the magnetic saturation state. The noise of the magnetic tunneling junctions is mainly caused by the electron capture effect of an oxide layer and movements of a magnetic domain wall in a magnetic layer. During low-frequency weak magnetic detection, 1/f noise of the magnetic tunneling junctions is the main noise source and is several times louder than white noise. According to the relation of the 1/f noise of the magnetic tunneling junctions with the magnetic layer, part of the 1/f noise is caused by the electrical mechanism (1/f noise caused by the defective "electron capture" mechanism of an insulating layer in the magnetic tunneling junctions, and part of the 1/f noise is caused by the magnetic mechanism (1/f noise caused by the thermally activated jump mechanism of the magnetic domain wall in the vicinity of a reference ferromagnetic layer).

Although the tunneling magnetoresistance sensors have the advantages of high sensitivity and miniaturization, their noise performance is the principal influence factor of the minimum magnetic field detection capacity of the sensors, particularly during geomagnetic field signal measurement where signals are low-frequency weak magnetic signals.

BRIEF SUMMARY OF THE INVENTION

The technical issue to be settled by the invention is to provide a signal processing circuit for a tunneling magnetoresistance sensor. The signal processing circuit is arranged at an output terminal of the tunneling magnetoresistance sensor to reject low-frequency 1/f noise in an output signal of the tunneling magnetoresistance sensor to increase the signal to noise ratio, such that a signal with a high signal to noise ratio can be output to eliminate the influence of the low-frequency 1/f noise on the minimum magnetic field detection capacity of the tunneling magnetoresistance sensor, thus ensuring that the tunneling magnetoresistance sensor has high sensitivity when used for measuring geomagnetic field signals.

The technical solution adopted by the invention to settle the above technical issue is as follows: a signal processing circuit for a tunneling magnetoresistance sensor comprises a first MOS transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor, a fifth MOS transistor, a sixth MOS transistor, a seventeenth MOS transistor, an eighteenth MOS transistor, a nineteenth MOS transistor, a twentieth MOS transistor, a twenty-first MOS transistor, a twenty-second MOS transistor, a twenty-third MOS transistor, a thirtieth MOS transistor, a thirty-first MOS transistor, a thirty-second MOS transistor, a thirty-third MOS transistor, a thirty-fourth MOS transistor, a thirty-fifth MOS transistor, a thirty-sixth MOS transistor, a thirty-seventh MOS transistor, a thirty-eighth MOS transistor, a first capacitor, a second capacitor and ten switches, wherein the ten switches are all analog switches, each switch has two connecting terminals which are referred to as a first connecting terminal and a second connecting terminal respectively and two clock control terminals which are referred to as a first clock terminal and a second clock terminal respectively, the ten switches are referred to a first switch, a second switch, a third switch, a fourth switch, a fifth switch, a sixth switch, a seventh switch, an eighth switch, a ninth switch and a tenth switch respectively, the first MOS transistor, the second MOS transistor, the third MOS transistor, the fourth MOS transistor, the fifth MOS transistor, the sixth MOS transistor, the seventh MOS transistor, the eleventh MOS transistor, the twelfth MOS transistor, the thirteenth MOS transistor, the fourteenth MOS transistor, the fifth MOS transistor, the sixteenth MOS transistor, the seventeenth MOS transistor, the eighteenth MOS transistor, the nineteenth MOS transistor, the thirtieth MOS transistor, the thirty-first MOS transistor, the thirty-second MOS transistor, the thirty-third MOS transistor, the thirty-fifth MOS transistor and the thirty-seventh MOS transistor are all PMOS transistors, and the eighth MOS transistor, the ninth MOS transistor, the tenth MOS transistor, the twentieth MOS transistor, the twenty-first MOS transistor, the twenty-second MOS transistor, the twenty-third MOS transistor, the thirty-fourth MOS transistor, the thirty-sixth MOS transistor and the thirty-eighth MOS transistor are all NMOS transistors; the first connecting terminal of the first switch and the first connecting terminal of the second switch are connected and a connecting terminal thereof is a positive input terminal Vin+ of the signal processing circuit and is connected to a positive output terminal of a tunneling magnetoresistance sensor, the first connecting terminal of the third switch and the first connecting terminal of the fourth switch are connected and a connecting terminal thereof is a negative input terminal Vin− of the signal processing circuit and is connected to a negative output terminal of the tunneling magnetoresistance sensor, the second connecting terminal of the first switch, the second connecting terminal of the third switch, a gate of the first MOS transistor and a gate of the third MOS transistor are connected, the second connecting terminal of the second switch, the second connecting terminal of the fourth switch, a gate of the second MOS transistor and a gate of the fourth MOS transistor are connected, a drain of the first MOS transistor and a source of the third MOS transistor are connected, a drain of the second MOS transistor and a source of the fourth MOS transistor are connected, a drain of the third MOS transistor and a gate of the ninth MOS transistor are connected, a drain of the fourth MOS transistor and gate of the tenth MOS transistor are connected, a source of the first MOS transistor, a source of the second MOS transistor and a drain of the sixth MOS transistor are connected, a source of the sixth MOS transistor and a drain of the fifth MOS transistor are connected, a source of the fifth MOS transistor, a source of the eleventh MOS transistor, a source of the twelfth MOS transistor, a source of the fifteenth MOS transistor, a source of the eighteenth MOS transistor, a source of the nineteenth MOS transistor, a source of the seventh MOS transistor, a source of the thirtieth MOS transistor and a source of the thirty-first MOS transistor are connected and a connecting terminal thereof allows a supply voltage VCC accessed thereto, a source of the ninth MOS transistor, a source of the tenth MOS transistor, a source of the twenty-second MOS transistor, a source of the twenty-third MOS transistor, a gate of the eighth MOS transistor, a source of the eighth MOS transistor and one terminal of the second capacitor are connected and a connecting terminal thereof is a negative output terminal Vout− of the signal processing circuit and is connected to the ground GND, a drain of the ninth MOS transistor, a drain of the thirteenth MOS transistor, a gate of the thirteenth MOS transistor, a gate of the fourteenth MOS transistor, the first connecting terminal of the fifth switch and the first connecting terminal of the sixth switch are connected, a drain of the tenth MOS transistor, a drain of the fourteenth MOS transistor, the first connecting terminal of the seventh switch and the first connecting terminal of the eighth switch are connected, a source of the thirteenth MOS transistor, a drain of the eleventh MOS transistor and the first connecting terminal of the ninth switch are connected, a source of the fourteenth MOS transistor, a drain of the twelfth MOS transistor and the first connecting terminal of the tenth switch are connected, the second connecting terminal of the ninth switch, the second connecting terminal of the tenth switch, a gate of the eleventh MOS transistor and a gate of the twelfth MOS transistor are connected, the second connecting terminal of the fifth switch, the second connecting terminal of the seventh switch, a gate of the sixteenth MOS transistor and the other terminal of the second capacitor are connected, the second connecting terminal of the sixth switch, the second connecting terminal of the eighth switch and a gate of the seventeenth MOS transistor are connected, a source of the sixteenth MOS transistor, a source of the seventeenth MOS transistor and a drain of the fifth MOS transistor are connected, a drain of the sixteenth MOS transistor, a drain of the twenty-second MOS transistor and a source of the twentieth MOS transistor are connected, a drain of the seventeenth MOS transistor and one terminal of the first capacitor are connected, a gate of the fifth MOS transistor, a gate of the fifteenth MOS transistor, a drain of the eighteenth MOS transistor, a drain of the twentieth MOS transistor, a gate of the eighteenth MOS transistor, a gate of the nineteenth MOS transistor, a gate of the thirtieth MOS transistor, a gate of the thirtieth-first MOS transistor, a drain of the thirtieth-second MOS transistor and a source of the thirtieth-fifth MOS transistor are connected, a gate of the sixth MOS transistor, a gate of the twentieth MOS transistor, a gate of the twenty-first MOS transistor, a gate of the thirty-second MOS transistor, a gate of the thirty-third MOS transistor, a drain of the thirty-fifth MOS transistor and a source of the thirty-seventh MOS transistor are connected, a drain of the nineteenth MOS transistor, a drain of the twenty-first MOS transistor and a gate of the seventh MOS transistor are connected, the other terminal of the first capacitor, a drain of the seventh MOS transistor and a drain of the eighth MOS transistor are connected and a connecting terminal thereof is a positive output terminal Vout+ of the signal processing circuit, and a source of the twenty-first MOS transistor and a drain of the twenty-third MOS transistor are connected; a gate of the twenty-second MOS transistor and a gate of the twenty-third MOS transistor are connected; a drain of the thirtieth MOS transistor and a source of the thirty-second MOS transistor are connected, a gate of the thirty-fifth MOS transistor, a gate of the thirty-seventh MOS transistor, a drain of the thirty-seventh MOS transistor and a source of the thirty-eighth MOS transistor are grounded, a drain of the thirty-first MOS transistor and a source of the thirty-third MOS transistor are connected, a drain of the thirty-third MOS transistor, a drain of the thirty-fourth MOS transistor, a gate of the thirty-fourth MOS transistor and a gate of the thirty-sixth MOS transistor are connected, a source of the thirty-fourth MOS transistor, a drain of the thirty-sixth MOS transistor and a gate of the thirty-eighth MOS transistor are connected, and a source of the thirty-sixth MOS transistor and a drain of the thirty-eighth MOS transistor are connected; the first clock terminal of the first switch, the second clock terminal of the second switch, the second clock terminal of the third switch, the first clock terminal of the fourth switch, the first clock terminal of the fifth switch, the second clock terminal of the sixth switch, the second clock terminal of the seventh switch, the first clock terminal of the eighth switch, the first clock terminal of the ninth switch and the first clock terminal of the tenth switch are connected and a connecting terminal thereof is a first clock terminal of the signal processing circuit and allows a clock signal clk to be accessed thereto, the second clock terminal of the first switch, the first clock terminal of the second switch, the first clock terminal of the third switch, the second clock terminal of the fourth switch, the second clock terminal of the fifth switch, the first clock terminal of the sixth switch, the first clock terminal of the seventh switch, the second clock terminal of the eighth switch, the second clock terminal of the ninth switch and the second clock terminal of the tenth switch are connected and a connecting terminal thereof is a second clock terminal of the signal processing circuit and allows a reverse clock signal clkb to be accessed thereto, the reverse clock signal clkb is a reverse signal of the clock signal clk, and the clock signal clk and the reverse clock signal clkb have a phase difference of 180° and are identical in amplitude.

Each switch comprises a twenty-fourth MOS transistor, a twenty-fifth MOS transistor, a twenty-sixth MOS transistor, a twenty-seventh MOS transistor, a twenty-eighth MOS transistor and a twenty-ninth MOS transistor, wherein the twenty-fourth MOS transistor, the twenty-fifth MOS transistor and the twenty-sixth MOS transistor are all NMOS transistors, and the twenty-seventh MOS transistor, the twenty-eighth MOS transistor and the twenty-ninth MOS transistor are all PMOS transistors; a gate of the twenty-fifth MOS transistor, a gate of the twenty-seventh MOS transistor and a gate of the twenty-ninth MOS transistor are connected and a connecting terminal thereof is a first clock terminal of the switch, a gate of the twenty-fourth MOS transistor, a gate of the twenty-sixth MOS transistor and a gate of the twenty-eighth MOS transistor are connected and a connecting terminal thereof is a second clock terminal of the switch, a source of the twenty-fourth MOS transistor and a source of the twenty-seventh MOS transistor are connected and a connecting terminal thereof is a first connecting terminal of the switch, a source of the twenty-sixth MOS transistor and a source of the twenty-ninth MOS transistor are connected and a connecting terminal thereof is a second connecting terminal of the switch, a drain of the twenty-fourth MOS transistor and a source of the twenty-fifth MOS transistor are connected, a drain of the twenty-fifth MOS transistor and a source of the twenty-sixth MOS transistor are connected, a drain of the twenty-seventh MOS transistor and a source of the twenty-eighth MOS transistor are connected, and a drain of the twenty-eighth MOS transistor and a source of the twenty-ninth MOS transistor are connected.

Compared with the prior art, the invention has the following advantages: the first switch, the second switch, the third switch, the fourth switch, the first MOS transistor, the second MOS transistor, the third MOS transistor and the fourth MOS transistor form a preceding circuit (high-frequency modulation circuit) of the signal processing circuit, the fifth switch, the sixth switch, the seventh switch, the eighth switch, the seventeenth MOS transistor, the twenty-second MOS transistor and the twenty-third MOS transistor form a post-circuit (high-frequency demodulation circuit) of the signal processing circuit, the first switch, the second switch, the third switch and the fourth switch are used as chopping switches, and the fifth switch, the sixth switch, the seventh switch and the eighth switch are used as demodulation switches; when an output signal $V_{out}$ of a tunneling magnetoresistance sensor is input via the positive input terminal $V_{in+}$ and the negative input terminal $V_{in-}$ of the signal processing circuit of the invention, and input signals $V_{in+}$ and $V_{in-}$ pass through the four chopping switches (the first switch, the second switch, the third switch and the fourth switch); in the first half cycle of a clock signal CLK, the second switch and the third switch are turned on, the first switch and the fourth switch are turned off, the signal $V_{in+}$ is loaded to the second MOS transistor and the fourth MOS transistor, and the signal $V_{in-}$ is loaded to the first MOS transistor and the third MOS transistor; in the second half cycle of the clock signal CLK, the first switch and the fourth switch are turned on, the second switch and the third switch are turned off, the signal $V_{in+}$ is loaded to the first MOS transistor and the third MOS transistor, the signal $V_{in-}$ is loaded to the second MOS transistor and the fourth MOS transistor, and this process is repeated until the signal $V_{in+}$ and the signal $V_{in-}$ are modulated to a clock frequency (chopping frequency); then, the four demodulation switches (the fifth switch, the sixth switch, the seventh switch and the eighth switch) are turned on or off for high-frequency demodulation to demodulate the signals to the original signal frequency, and in this process, noise and offset voltage are modulated once into high-frequency ripples at a frequency which is odd times of the chopping frequency; and finally, the high-frequency ripples are filtered out by a lowpass filter, and the chopping modulation technique can avoid noise aliasing in the noise frequency domain and will not introduce extra baseband thermal noise, thus being suitable for a continuous low-frequency signal detection circuit. Therefore, by adopting the signal processing circuit provided by the invention, 1/f noise can be reduced effectively without increasing white noise; and when arranged at the output terminal of the tunneling magnetoresistance sensor, the signal processing circuit can effectively reject low-frequency 1/f noise in an output signal of the tunneling magnetoresistance sensor to increase the signal to noise ratio, such that a signal with a high signal to noise ratio can be output to eliminate the influence of the low-frequency 1/f noise on the minimum magnetic field detection capacity of the tunneling magnetoresistance sensor, thus ensuring that the tunneling magnetoresistance sensor has high sensitivity when used for measuring geomagnetic field signals.

DETAILED DESCRIPTION OF THE INVENTION

The invention will be described in further detail below in conjunction with the accompanying drawings.

Figure 1:
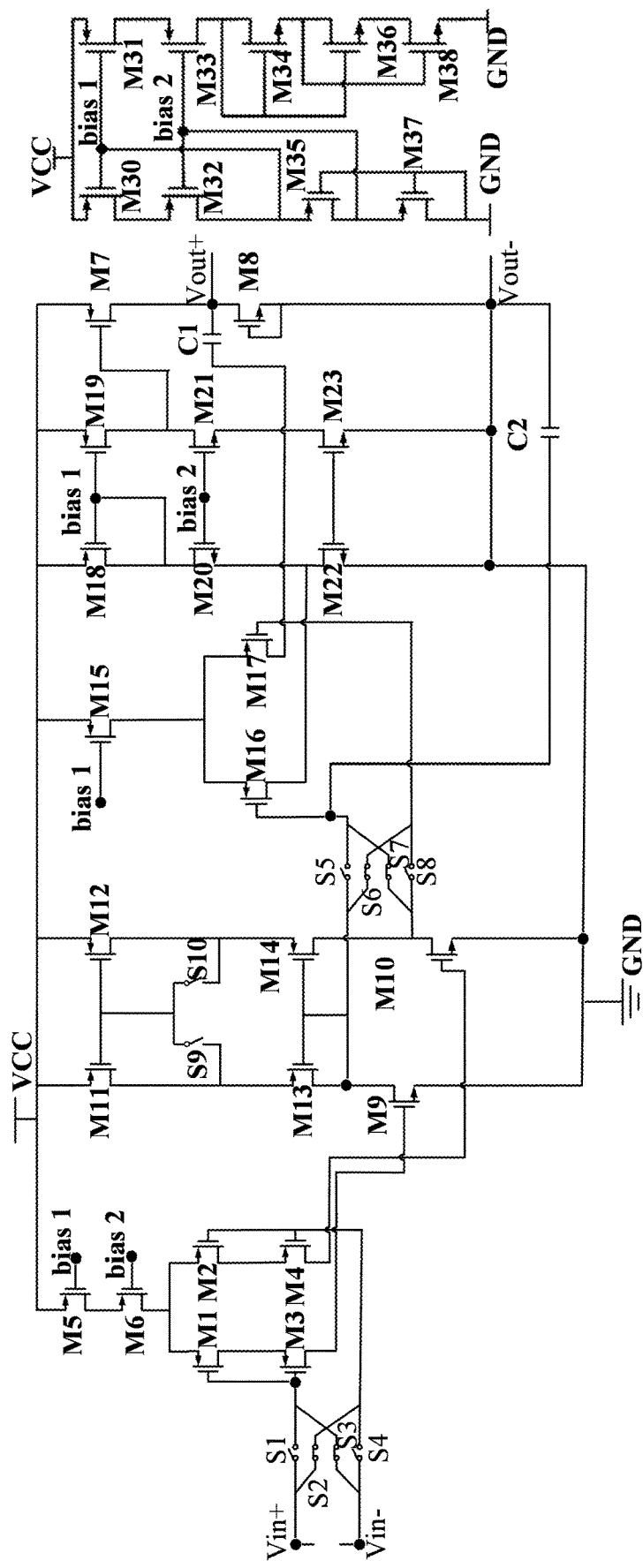
FIG. 1 is a circuit diagram of a signal processing circuit for a tunneling magnetoresistance sensor according to the invention.

Embodiment 1: As shown in FIG. 1, a signal processing circuit for a tunneling magnetoresistance sensor comprises a first MOS transistor M1, a second MOS transistor M2, a third MOS transistor M3, a fourth MOS transistor M4, a fifth MOS transistor M5, a sixth MOS transistor M6, a seventh MOS transistor M7, an eighth MOS transistor M8, a ninth MOS transistor M9, a tenth MOS transistor M10, an eleventh MOS transistor M11, a twelfth MOS transistor M12, a thirteenth MOS transistor M13, a fourteenth MOS transistor M14, a fifth MOS transistor M15, a sixth MOS transistor M16, a seventeenth MOS transistor M17, an eighteenth MOS transistor M18, a nineteenth MOS transistor M19, a twentieth MOS transistor M20, a twenty-first MOS transistor M21, a twenty-second MOS transistor M22, a twenty-third MOS transistor M23, a thirtieth MOS transistor M30, a thirty-first MOS transistor M31, a thirty-second MOS transistor M32, a thirty-third MOS transistor M33, a thirty-fourth MOS transistor M34, a thirty-fifth MOS transistor M35, a thirty-sixth MOS transistor M36, a thirty-seventh MOS transistor M37, a thirty-eighth MOS transistor M38, a first capacitor C1, a second capacitor C2 and ten switches, wherein the first capacitor C1 and the second capacitor C2 are both miller compensation capacitors, the ten switches are all analog switches, each switch has two connecting terminals which are referred to as a first connecting terminal and a second connecting terminal respectively and two clock control terminals which are referred to as a first clock terminal and a second clock terminal respectively, the ten switches are referred to a first switch S1, a second switch S2, a third switch S3, a fourth switch S4, a fifth switch S5, a sixth switch S6, a seventh switch S7, an eighth switch S8, a ninth switch S9 and a tenth switch S10 respectively, the first MOS transistor M1, the second MOS transistor M2, the third MOS transistor M3, the fourth MOS transistor M4, the fifth MOS transistor M5, the sixth MOS transistor M6, the seventh MOS transistor M7, the eleventh MOS transistor M11, the twelfth MOS transistor M12, the thirteenth MOS transistor M13, the fourteenth MOS transistor M14, the fifth MOS transistor M15, the sixteenth MOS transistor M16, the seventeenth MOS transistor M17, the eighteenth MOS transistor M18, the nineteenth MOS transistor M19, the thirtieth MOS transistor M30, the thirty-first MOS transistor M31, the thirty-second MOS transistor M32, the thirty-third MOS transistor M33, the thirty-fifth MOS transistor M35 and the thirty-seventh MOS transistor M37 are all PMOS transistors, and the eighth MOS transistor M8, the ninth MOS transistor M9, the tenth MOS transistor M10, the twentieth MOS transistor M20, the twenty-first MOS transistor M21, the twenty-second MOS transistor M22, the twenty-third MOS transistor M23, the thirty-fourth MOS transistor M34, the thirty-sixth MOS transistor M36 and the thirty-eighth MOS transistor M38 are all NMOS transistors; the first connecting terminal of the first switch S1 and the first connecting terminal of the second switch S2 are connected and a connecting terminal thereof is a positive input terminal Vin+ of the signal processing circuit and is connected to a positive output terminal of a tunneling magnetoresistance sensor, the first connecting terminal of the third switch S3 and the first connecting terminal of the fourth switch S4 are connected and a connecting terminal thereof is a negative input terminal Vin− of the signal processing circuit and is connected to a negative output terminal of the tunneling magnetoresistance sensor, the second connecting terminal of the first switch S1, the second connecting terminal of the third switch S3, a gate of the first MOS transistor M1 and a gate of the third MOS transistor M3 are connected, the second connecting terminal of the second switch S2, the second connecting terminal of the fourth switch S4, a gate of the second MOS transistor M2 and a gate of the fourth MOS transistor M4 are connected, a drain of the first MOS transistor M1 and a source of the third MOS transistor M3 are connected, a drain of the second MOS transistor M2 and a source of the fourth MOS transistor M4 are connected, a drain of the third MOS transistor M3 and a gate of the ninth MOS transistor M9 are connected, a drain of the fourth MOS transistor M4 and gate of the tenth MOS transistor M10 are connected, a source of the first MOS transistor M1, a source of the second MOS transistor M2 and a drain of the sixth MOS transistor M6 are connected, a source of the sixth MOS transistor M6 and a drain of the fifth MOS transistor M5 are connected, a source of the fifth MOS transistor M5, a source of the eleventh MOS transistor M11, a source of the twelfth MOS transistor M12, a source of the fifteenth MOS transistor M15, a source of the eighteenth MOS transistor M18, a source of the nineteenth MOS transistor M19, a source of the seventh MOS transistor M7, a source of the thirtieth MOS transistor M30 and a source of the thirty-first MOS transistor M31 are connected and a connecting terminal thereof allows a supply voltage VCC accessed thereto, a source of the ninth MOS transistor M9, a source of the tenth MOS transistor M10, a source of the twenty-second MOS transistor M22, a source of the twenty-third MOS transistor M23, a gate of the eighth MOS transistor M8, a source of the eighth MOS transistor M8 and one terminal of the second capacitor C2 are connected and a connecting terminal thereof is a negative output terminal Vout− of the signal processing circuit and is connected to the ground GND, a drain of the ninth MOS transistor M9, a drain of the thirteenth MOS transistor M13, a gate of the thirteenth MOS transistor M13, a gate of the fourteenth MOS transistor M14, the first connecting terminal of the fifth switch S5 and the first connecting terminal of the sixth switch S6 are connected, a drain of the tenth MOS transistor M10, a drain of the fourteenth MOS transistor M14, the first connecting terminal of the seventh switch S7 and the first connecting terminal of the eighth switch S9 are connected, a source of the thirteenth MOS transistor M13, a drain of the eleventh MOS transistor M1*l* and the first connecting terminal of the ninth switch S9 are connected, a source of the fourteenth MOS transistor M14, a drain of the twelfth MOS transistor M12 and the first connecting terminal of the tenth switch S10 are connected, the second connecting terminal of the ninth switch S9, the second connecting terminal of the tenth switch S10, a gate of the eleventh MOS transistor M11 and a gate of the twelfth MOS transistor M12 are connected, the second connecting terminal of the fifth switch S5, the second connecting terminal of the seventh switch S7, a gate of the sixteenth MOS transistor M16 and the other terminal of the second capacitor C2 are connected, the second connecting terminal of the sixth switch S6, the second connecting terminal of the eighth switch S8 and a gate of the seventeenth MOS transistor M17 are connected, a source of the sixteenth MOS transistor M16, a source of the seventeenth MOS transistor M17 and a drain of the fifth MOS transistor M15 are connected, a drain of the sixteenth MOS transistor M16, a drain of the twenty-second MOS transistor M22 and a source of the twentieth MOS transistor M20 are connected, a drain of the seventeenth MOS transistor M17 and one terminal of the first capacitor C1 are connected, a gate of the fifth MOS transistor M5, a gate of the fifteenth MOS transistor M15, a drain of the eighteenth MOS transistor M18, a drain of the twentieth MOS transistor M20, a gate of the eighteenth MOS transistor M18, a gate of the nineteenth MOS transistor M19, a gate of the thirtieth MOS transistor M30, a gate of the thirtieth-first MOS transistor M31, a drain of the thirtieth-second MOS transistor M32 and a source of the thirtieth-fifth MOS transistor M35 are connected, a gate of the sixth MOS transistor M6, a gate of the twentieth MOS transistor M20, a gate of the twenty-first MOS transistor M21, a gate of the thirty-second MOS transistor M32, a gate of the thirty-third MOS transistor M33, a drain of the thirty-fifth MOS transistor M35 and a source of the thirty-seventh MOS transistor M37 are connected, a drain of the nineteenth MOS transistor M19, a drain of the twenty-first MOS transistor M21 and a gate of the seventh MOS transistor are connected M7, the other terminal of the first capacitor C1, a drain of the seventh MOS transistor M7 and a drain of the eighth MOS transistor M8 are connected and a connecting terminal thereof is a positive output terminal Vout+ of the signal processing circuit, and a source of the twenty-first MOS transistor M21 and a drain of the twenty-third MOS transistor M23 are connected; a gate of the twenty-second MOS transistor M22 and a gate of the twenty-third MOS transistor M23 are connected; a drain of the thirtieth MOS transistor M30 and a source of the thirty-second MOS transistor M32 are connected, a gate of the thirty-fifth MOS transistor M35, a gate of the thirty-seventh MOS transistor M37, a drain of the thirty-seventh MOS transistor M37 and a source of the thirty-eighth MOS transistor M38 are grounded, a drain of the thirty-first MOS transistor M31 and a source of the thirty-third MOS transistor M33 are connected, a drain of the thirty-third MOS transistor M33, a drain of the thirty-fourth MOS transistor M34, a gate of the thirty-fourth MOS transistor M34 and a gate of the thirty-sixth MOS transistor M33 are connected, a source of the thirty-fourth MOS transistor M34, a drain of the thirty-sixth MOS transistor M36 and a gate of the thirty-eighth MOS transistor M38 are connected, and a source of the thirty-sixth MOS transistor M36 and a drain of the thirty-eighth MOS transistor M38 are connected; the first clock terminal of the first switch S1, the second clock terminal of the second switch S2, the second clock terminal of the third switch S3, the first clock terminal of the fourth switch S4, the first clock terminal of the fifth switch S5, the second clock terminal of the sixth switch S6, the second clock terminal of the seventh switch S7, the first clock terminal of the eighth switch S8, the first clock terminal of the ninth switch S9 and the first clock terminal of the tenth switch S10 are connected and a connecting terminal thereof is a first clock terminal of the signal processing circuit and allows a clock signal clk to be accessed thereto, the second clock terminal of the first switch S1, the first clock terminal of the second switch S2, the first clock terminal of the third switch S3, the second clock terminal of the fourth switch S4, the second clock terminal of the fifth switch S5, the first clock terminal of the sixth switch S6, the first clock terminal of the seventh switch S7, the second clock terminal of the eighth switch S8, the second clock terminal of the ninth switch S9 and the second clock terminal of the tenth switch S10 are connected and a connecting terminal thereof is a second clock terminal of the signal processing circuit and allows a reverse clock signal clkb to be accessed thereto, the reverse clock signal clkb is a reverse signal of the clock signal clk, and the clock signal clk and the reverse clock signal clkb have a phase difference of 180° and are identical in amplitude.

Figure 2:
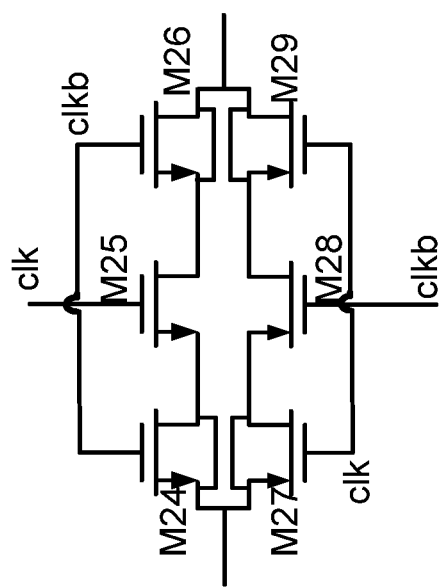
FIG. 2 is a circuit diagram of a switch of the signal processing circuit for a tunneling magnetoresistance sensor according to the invention.

Embodiment 2: This embodiment is basically the same as Embodiment 1 and differs from Embodiment 1 in the following aspects: as shown in FIG. 2, in this embodiment, each switch comprises a twenty-fourth MOS transistor M24, a twenty-fifth MOS transistor M25, a twenty-sixth MOS transistor M26, a twenty-seventh MOS transistor M27, a twenty-eighth MOS transistor M28 and a twenty-ninth MOS transistor M29, wherein the twenty-fourth MOS transistor M24, the twenty-fifth MOS transistor M25 and the twenty-sixth MOS transistor M26 are all NMOS transistors, and the twenty-seventh MOS transistor M27, the twenty-eighth MOS transistor M28 and the twenty-ninth MOS transistor M29 are all PMOS transistors; a gate of the twenty-fifth MOS transistor M25, a gate of the twenty-seventh MOS transistor M27 and a gate of the twenty-ninth MOS transistor M29 are connected and a connecting terminal thereof is a first clock terminal of the switch, a gate of the twenty-fourth MOS transistor M24, a gate of the twenty-sixth MOS transistor M26 and a gate of the twenty-eighth MOS transistor M27 are connected and a connecting terminal thereof is a second clock terminal of the switch, a source of the twenty-fourth MOS transistor M24 and a source of the twenty-seventh MOS transistor M27 are connected and a connecting terminal thereof is a first connecting terminal of the switch, a source of the twenty-sixth MOS transistor M26 and a source of the twenty-ninth MOS transistor M29 are connected and a connecting terminal thereof is a second connecting terminal of the switch, a drain of the twenty-fourth MOS transistor M24 and a source of the twenty-fifth MOS transistor M25 are connected, a drain of the twenty-fifth MOS transistor M25 and a source of the twenty-sixth MOS transistor M26 are connected, a drain of the twenty-seventh MOS transistor M27 and a source of the twenty-eighth MOS transistor M28 are connected, and a drain of the twenty-eighth MOS transistor M28 and a source of the twenty-ninth MOS transistor M29 are connected.

Figure 3:
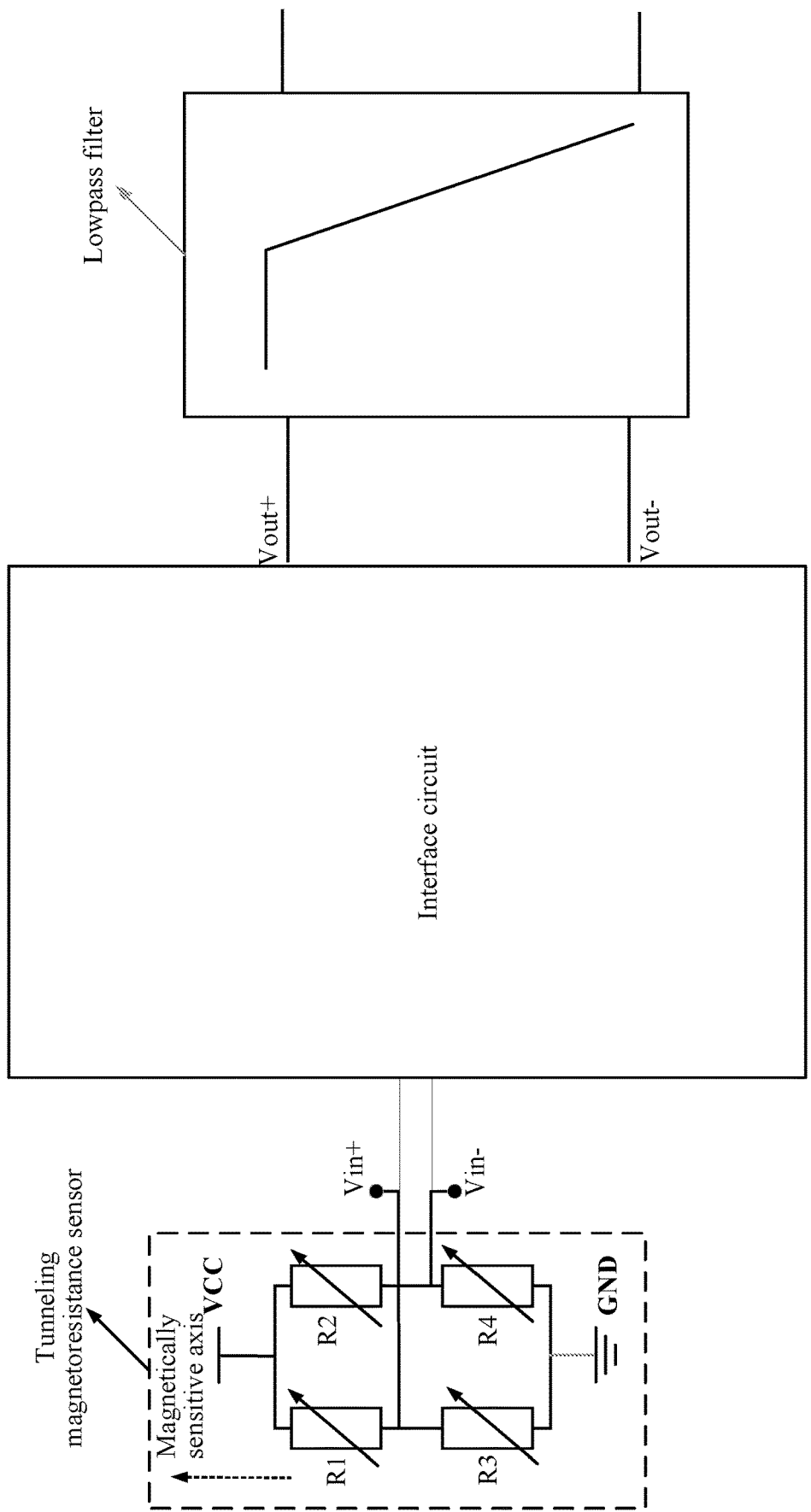
FIG. 3 is a connection diagram of the signal processing circuit for a tunneling magnetoresistance sensor and the tunneling magnetoresistance sensor according to the invention.

A tunneling magnetoresistance sensor is formed by multiple magnetic tunneling junctions which are connected in series. In a case where a magnetic field changes, the resistance of the magnetic tunneling junctions will change accordingly. Generally, in order to improve the sensitivity and linearity of the tunneling magnetoresistance sensor, four tunnelling magnetically sensitive resistors with high sensitivity are used to form a tunneling magnetoresistance sensor of a push-pull Wheatstone bridge structure. The tunneling magnetoresistance sensor of the push-pull Wheatstone bridge structure adopts a full-bridge design, and thus can effectively reject and eliminate common-mode environmental noise. The Wheatstone bridge circuit diagram of the tunneling magnetoresistance sensor of a multi-film structure based on the thin-film resistor process is shown in FIG. 3. In an ideal condition, if the sensitive resistors on the bridge of the tunneling magnetoresistance sensor have the same resistance, an output of the tunneling magnetoresistance sensor will not be offset, and the fully differential output can eliminate even harmonic components, thus improving the linearity. When the magnetic field in the external environment changes, the resistance of the sensitive resistors will change accordingly, the differentially changing signal in the bridge will be sensed by the post-circuit of the signal processing circuit, such that an external magnetic field signal is measured. The sensitive directions of the tunnelling magnetoresistors R1, R2, R3 and R4 are the same. Under an ideal condition, if the external magnetic field is zero, the tunnelling magnetoresistors on the bridges have the same resistance, that is, R1=R2=R3=R4, and the differential output signal of the bridge is zero. When the external magnetic field is not zero, the resistance of the tunnelling magnetoresistors R1, R2, R3 and R4 will change under the action of the magnetic field, the variation ΔR of the resistance is equal in amplitude and opposite in direction, that is, R1=R3=R+ΔR, R2=R4=R−ΔR, a magnetic signal is converted into a weak differential voltage signal, and at this moment, an output signal $V_{out}$ can be expressed as:

$$V_{out} = V_{CC}\left(\frac{R_1}{R_1+R_4} - \frac{R_2}{R_2+R_3}\right) \quad (1)$$
$$= V_{CC}\left(\frac{R+\Delta R}{2R} - \frac{R-\Delta R}{2R}\right) = V_{CC}\frac{\Delta R}{R}$$

$V_{out}$ is the differential voltage between the positive input terminal $V_{in+}$ and the negative input terminal $V_{in-}$ of the signal processing circuit provided by the invention, and is expressed as $V_{in+}-V_{in-}=V_{out}$.

To accurately detect a millivolt differential mode signal output by the tunneling magnetoresistance sensor, the signal processing circuit should have a high common mode rejection ratio and a high signal to noise ratio with a low-frequency range, and should also satisfy the following technical indicators: input related errors should be on the microvolt level or the nanovolt level; the common mode rejection ratio (CMRR) should be high enough to reject common mode signals; the input impedance should be high enough to prevent the output signal of the tunneling magnetoresistance sensor from being decreased; and the signal processing circuit should have a high noise corner frequency to ensure that the signal output by the tunneling magnetoresistance sensor can be extracted effectively. In a signal detection system of the tunneling magnetoresistance sensor, the preceding circuit of the signal processing circuit is of great importance and determines the overall performance of the sensor system.

Figure 4:
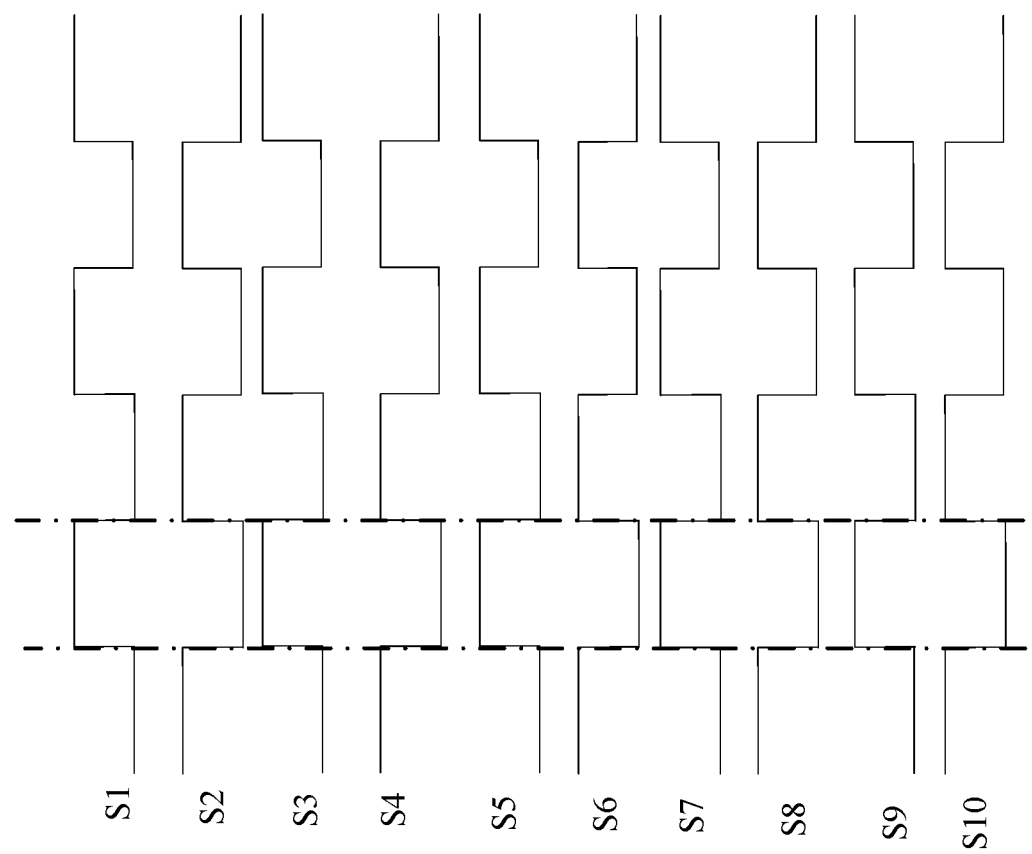
FIG. 4 is a sequence diagram of ten switches of the signal processing circuit for a tunneling magnetoresistance sensor according to the invention.

In the signal processing circuit provided by the invention, the first switch S1, the second switch S2, the third switch S3, the fourth switch S4, the first MOS transistor M1, the second MOS transistor M2, the third MOS transistor M3 and the fourth MOS transistor M4 form a preceding circuit (high-frequency modulation circuit) of the signal processing circuit, the fifth switch S5, the sixth switch S6, the seventh switch S7, the eighth switch S8, the seventeenth MOS transistor M17, the twenty-second MOS transistor M22 and the twenty-third MOS transistor M23 form a post-circuit (high-frequency demodulation circuit) of the signal processing circuit, the first switch S1, the second switch S2, the third switch S3 and the fourth switch S4 are used as chopping switches, and the fifth switch S5, the sixth switch S6, the seventh switch S7 and the eighth switch S8 are used as demodulation switches; when an output signal $V_{out}$ of a tunneling magnetoresistance sensor is input via the positive input terminal $V_{in+}$ and the negative input terminal $V_{in-}$ of the signal processing circuit of the invention, and input signals $V_{in+}$ and $V_{in-}$ pass through the four chopping switches (the first switch S1, the second switch S2, the third switch S3 and the fourth switch S4); in the first half cycle of a clock signal CLK, the second switch S2 and the third switch S3 are turned on, the first switch S1 and the fourth switch S4 are turned off, the signal $V_{in+}$ is loaded to the second MOS transistor M2 and the fourth MOS transistor M4, and the signal $V_{in-}$ is loaded to the first MOS transistor M1 and the third MOS transistor M3; in the second half cycle of the clock signal CLK, the first switch S1 and the fourth switch S4 are turned on, the second switch S2 and the third switch S3 are turned off, the signal $V_{in+}$ is loaded to the first MOS transistor M1 and the third MOS transistor M3, the signal $V_{in-}$ is loaded to the second MOS transistor M2 and the fourth MOS transistor M4, and this process is repeated until the signal $V_{in+}$ and the signal $V_{in-}$ are modulated to a clock frequency (chopping frequency); then, the four demodulation switches (the fifth switch S5, the sixth switch S6, the seventh switch S7 and the eighth switch S8) are turned on or off for high-frequency demodulation to demodulate the signals to the original signal frequency, and in this process, noise and offset voltage are modulated once into high-frequency ripples at a frequency which is odd times of the chopping frequency; and finally, the high-frequency ripples are filtered out by a lowpass filter, and the chopping modulation technique can avoid noise aliasing in the noise frequency domain and will not introduce extra baseband thermal noise, thus being suitable for a continuous low-frequency signal detection circuit. Therefore, by adopting the signal processing circuit provided by the invention, 1/f noise can be reduced effectively without increasing white noise. In order to minimize noise and avoid noise caused by other undesired factors, the signal processing circuit should not generate a phase shift at the chopping frequency when designed; the chopping frequency should be higher than the corner frequency of 1/f noise of an operational amplifier; and the circuit bandwidth should be properly decreased under the condition where excessive thermal noise will not be introduced within the bandwidth of input signals and the DC gain of the operational amplifier is not decreased. The sequence diagram of the ten switches of the signal processing circuit for a tunneling magnetoresistance sensor provided by the invention is shown in FIG. 4. It can be known by analyzing FIG. 4 that the ten switches are alternately turned on and off under the control of a clock signal to realize demodulation and modulation.

What is claimed is:

1. A signal processing circuit for a tunneling magnetoresistance sensor, wherein the signal processing circuit comprises a first metal-oxide-semiconductor (MOS) transistor, a second MOS transistor, a third MOS transistor, a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, a thirteenth MOS transistor, a fourteenth MOS transistor, a fifteenth MOS transistor, a sixteenth MOS transistor, a seventeenth MOS transistor, an eighteenth MOS transistor, a nineteenth MOS transistor, a twentieth MOS transistor, a twenty-first MOS transistor, a twenty-second MOS transistor, a twenty-third MOS transistor, a thirtieth MOS transistor, a thirty-first MOS transistor, a thirty-second MOS transistor, a thirty-third MOS transistor, a thirty-fourth MOS transistor, a thirty-fifth MOS transistor, a thirty-sixth MOS transistor, a thirty-seventh MOS transistor, a thirty-eighth MOS transistor, a first capacitor, a second capacitor and ten switches, wherein the ten switches are all analog switches, each switch has two connecting terminals which are referred to as a first connecting terminal and a second connecting terminal respectively and two clock control terminals which are referred to as a first clock terminal and a second clock terminal respectively, the ten switches are referred to a first switch, a second switch, a third switch, a fourth switch, a fifth switch, a sixth switch, a seventh switch, an eighth switch, a ninth switch and a tenth switch respectively, the first MOS transistor, the second MOS transistor, the third MOS transistor, the fourth MOS transistor, the fifth MOS transistor, the sixth MOS transistor, the seventh MOS transistor, the eleventh MOS transistor, the twelfth MOS transistor, the thirteenth MOS transistor, the fourteenth MOS transistor, the fifteenth MOS transistor, the sixteenth MOS transistor, the seventeenth MOS transistor, the eighteenth MOS transistor, the nineteenth MOS transistor, the thirtieth MOS transistor, the thirty-first MOS transistor, the thirty-second MOS transistor, the thirty-third MOS transistor, the thirty-fifth MOS transistor and the thirty-seventh MOS transistor are all PMOS transistors, and the eighth MOS transistor, the ninth MOS transistor, the tenth MOS transistor, the twentieth MOS transistor, the twenty-first MOS transistor, the twenty-second MOS transistor, the twenty-third MOS transistor, the thirty-fourth MOS transistor, the thirty-sixth MOS transistor and the thirty-eighth MOS transistor are all NMOS transistors; the first connecting terminal of the first switch and the first connecting terminal of the second switch are connected and a connecting terminal thereof is a positive input terminal Vin+ of the signal processing circuit and is connected to a positive output terminal of the tunneling magnetoresistance sensor, the first connecting terminal of the third switch and the first connecting terminal of the fourth switch are connected and a connecting terminal thereof is a negative input terminal Vin− of the signal processing circuit and is connected to a negative output terminal of the tunneling magnetoresistance sensor, the second connecting terminal of the first switch, the second connecting terminal of the third switch, a gate of the first MOS transistor and a gate of the third MOS transistor are connected, the second connecting terminal of the second switch, the second connecting terminal of the fourth switch, a gate of the second MOS transistor and a gate of the fourth MOS transistor are connected, a drain of the first MOS transistor and a source of the third MOS transistor are connected, a drain of the second MOS transistor and a source of the fourth MOS transistor are connected, a drain of the third MOS transistor and a gate of the ninth MOS transistor are connected, a drain of the fourth MOS transistor and gate of the tenth MOS transistor are connected, a source of the first MOS transistor, a source of the second MOS transistor and a drain of the sixth MOS transistor are connected, a source of the sixth MOS transistor and a drain of the fifth MOS transistor are connected, a source of the fifth MOS transistor, a source of the eleventh MOS transistor, a source of the twelfth MOS transistor, a source of the fifteenth MOS transistor, a source of the eighteenth MOS transistor, a source of the nineteenth MOS transistor, a source of the seventh MOS transistor, a source of the thirtieth MOS transistor and a source of the thirty-first MOS transistor are connected and a connecting terminal thereof allows a supply voltage VCC accessed thereto, a source of the ninth MOS transistor, a source of the tenth MOS transistor, a source of the twenty-second MOS transistor, a source of the twenty-third MOS transistor, a gate of the eighth MOS transistor, a source of the eighth MOS transistor and one terminal of the second capacitor are connected and a connecting terminal thereof is a negative output terminal Vout− of the signal processing circuit and is connected to a ground GND, a drain of the ninth MOS transistor, a drain of the thirteenth MOS transistor, a gate of the thirteenth MOS transistor, a gate of the fourteenth MOS transistor, the first connecting terminal of the fifth switch and the first connecting terminal of the sixth switch are connected, a drain of the tenth MOS transistor, a drain of the fourteenth MOS transistor, the first connecting terminal of the seventh switch and the first connecting terminal of the eighth switch are connected, a source of the thirteenth MOS transistor, a drain of the eleventh MOS transistor and the first connecting terminal of the ninth switch are connected, a source of the fourteenth MOS transistor, a drain of the twelfth MOS transistor and the first connecting terminal of the tenth switch are connected, the second connecting terminal of the ninth switch, the second connecting terminal of the tenth switch, a gate of the eleventh MOS transistor and a gate of the twelfth MOS transistor are connected, the second connecting terminal of the fifth switch, the second connecting terminal of the seventh switch, a gate of the sixteenth MOS transistor and the other terminal of the second capacitor are connected, the second connecting terminal of the sixth switch, the second connecting terminal of the eighth switch and a gate of the seventeenth MOS transistor are connected, a source of the sixteenth MOS transistor, a source of the seventeenth MOS transistor and a drain of the fifth MOS transistor are connected, a drain of the sixteenth MOS transistor, a drain of the twenty-second MOS transistor and a source of the twentieth MOS transistor are connected, a drain of the seventeenth MOS transistor and one terminal of the first capacitor are connected, a gate of the fifth MOS transistor, a gate of the fifteenth MOS transistor, a drain of the eighteenth MOS transistor, a drain of the twentieth MOS transistor, a gate of the eighteenth MOS transistor, a gate of the nineteenth MOS transistor, a gate of the thirtieth MOS transistor, a gate of the thirtieth-first MOS transistor, a drain of the thirtieth-second MOS transistor and a source of the thirtieth-fifth MOS transistor are connected, a gate of the sixth MOS transistor, a gate of the twentieth MOS transistor, a gate of the twenty-first MOS transistor, a gate of the thirty-second MOS transistor, a gate of the thirty-third MOS transistor, a drain of the thirty-fifth MOS transistor and a source of the thirty-seventh MOS transistor are connected, a drain of the nineteenth MOS transistor, a drain of the twenty-first MOS transistor and a gate of the seventh MOS transistor are connected, the other terminal of the first capacitor, a drain of the seventh MOS transistor and a drain of the eighth MOS transistor are connected and a connecting terminal thereof is a positive output terminal Vout+ of the signal processing circuit, and a source of the twenty-first MOS transistor and a drain of the twenty-third MOS transistor are connected; a gate of the twenty-second MOS transistor and a gate of the twenty-third MOS transistor are connected; a drain of the thirtieth MOS transistor and a source of the thirty-second MOS transistor are connected, a gate of the thirty-fifth MOS transistor, a gate of the thirty-seventh MOS transistor, a drain of the thirty-seventh MOS transistor and a source of the thirty-eighth MOS transistor are grounded, a drain of the thirty-first MOS transistor and a source of the thirty-third MOS transistor are connected, a drain of the thirty-third MOS transistor, a drain of the thirty-fourth MOS transistor, a gate of the thirty-fourth MOS transistor and a gate of the thirty-sixth MOS transistor are connected, a source of the thirty-fourth MOS transistor, a drain of the thirty-sixth MOS transistor and a gate of the thirty-eighth MOS transistor are connected, and a source of the thirty-sixth MOS transistor and a drain of the thirty-eighth MOS transistor are connected; the first clock terminal of the first switch, the second clock terminal of the second switch, the second clock terminal of the third switch, the first clock terminal of the fourth switch, the first clock terminal of the fifth switch, the second clock terminal of the sixth switch, the second clock terminal of the seventh switch, the first clock terminal of the eighth switch, the first clock terminal of the ninth switch and the first clock terminal of the tenth switch are connected and a connecting terminal thereof is a first clock terminal of the signal processing circuit and allows a clock signal clk to be accessed thereto, the second clock terminal of the first switch, the first clock terminal of the second switch, the first clock terminal of the third switch, the second clock terminal of the fourth switch, the second clock terminal of the fifth switch, the first clock terminal of the sixth switch, the first clock terminal of the seventh switch, the second clock terminal of the eighth switch, the second clock terminal of the ninth switch and the second clock terminal of the tenth switch are connected and a connecting terminal thereof is a second clock terminal of the signal processing circuit and allows a reverse clock signal clkb to be accessed thereto, the reverse clock signal clkb is a reverse signal of the clock signal clk, and the clock signal clk and the reverse clock signal clkb have a phase difference of 180° and are identical in amplitude.

2. A signal processing circuit for a tunneling magnetoresistance sensor to claim 1, wherein each switch comprises a twenty-fourth MOS transistor, a twenty-fifth MOS transistor, a twenty-sixth MOS transistor, a twenty-seventh MOS transistor, a twenty-eighth MOS transistor and a twenty-ninth MOS transistor, wherein the twenty-fourth MOS transistor, the twenty-fifth MOS transistor and the twenty-sixth MOS transistor are all NMOS transistors, and the twenty-seventh MOS transistor, the twenty-eighth MOS transistor and the twenty-ninth MOS transistor are all PMOS transistors; a gate of the twenty-fifth MOS transistor, a gate of the twenty-seventh MOS transistor and a gate of the twenty-ninth MOS transistor are connected and a connecting terminal thereof is the first clock terminal of the switch, a gate of the twenty-fourth MOS transistor, a gate of the twenty-sixth MOS transistor and a gate of the twenty-eighth MOS transistor are connected and a connecting terminal thereof is the second clock terminal of the switch, a source of the twenty-fourth MOS transistor and a source of the twenty-seventh MOS transistor are connected and a connecting terminal thereof is the first connecting terminal of the switch, a source of the twenty-sixth MOS transistor and a source of the twenty-ninth MOS transistor are connected and a connecting terminal thereof is the second connecting terminal of the switch, a drain of the twenty-fourth MOS transistor and a source of the twenty-fifth MOS transistor are connected, a drain of the twenty-fifth MOS transistor and a source of the twenty-sixth MOS transistor are connected, a drain of the twenty-seventh MOS transistor and a source of the twenty-eighth MOS transistor are connected, and a drain of the twenty-eighth MOS transistor and a source of the twenty-ninth MOS transistor are connected.

\* \* \* \* \*